United States Patent
Kudou

(10) Patent No.: US 10,283,595 B2
(45) Date of Patent: May 7, 2019

(54) SILICON CARBIDE SEMICONDUCTOR SUBSTRATE USED TO FORM SEMICONDUCTOR EPITAXIAL LAYER THEREON

(71) Applicant: Panasonic Corporation, Osaka (JP)

(72) Inventor: Chiaki Kudou, Toyama (JP)

(73) Assignee: PANASONIC CORPORATION, Osaka (JP)

(*) Notice: Subject to any disclaimer, the term of this patent is extended or adjusted under 35 U.S.C. 154(b) by 138 days.

(21) Appl. No.: 15/074,847

(22) Filed: Mar. 18, 2016

(65) Prior Publication Data

US 2016/0300910 A1    Oct. 13, 2016

(30) Foreign Application Priority Data

Apr. 10, 2015    (JP) ................. 2015-080990

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02024* (2013.01); *H01L 21/02035* (2013.01);
(Continued)

(58) Field of Classification Search
CPC .. H01L 21/02013–21/02016; H01L 21/02024; H01L 21/02378; H01L 29/1608;
(Continued)

(56) References Cited

U.S. PATENT DOCUMENTS 3,905,162 A * 9/1975 Lawrence ................. B24B 1/00
                                                            117/913
4,587,771 A * 5/1986 Buchner ........... H01L 21/02016
                                                       257/E21.237
(Continued)

FOREIGN PATENT DOCUMENTS

JP         61-032423           2/1986
JP         61-065439           4/1986
(Continued)

OTHER PUBLICATIONS

Xuan Zhang et al., "Correlation between Thermal Stress and Formation of Interfacial Dislocations during 4H—SiC Epitaxy and Thermal Annealing" Materials Science Forum vols. 679-680, 2011, pp. 306-309.

*Primary Examiner* — Marvin Payen
*Assistant Examiner* — Jeremy J Joy
(74) *Attorney, Agent, or Firm* — McDermott Will & Emery LLP

(57) ABSTRACT

A silicon carbide semiconductor substrate according to an aspect of the present disclosure has a first principal surface and a second principal surface opposite to the first principal surface. The silicon carbide semiconductor substrate includes a silicon carbide semiconductor crystal, and a first affected layer having crystal disturbances and disposed under the first principal surface. A thickness of the first affected layer in a first region including a center of the first principal surface is smaller than a thickness of the first affected layer in a second region surrounding the first region in a plane view.

2 Claims, 14 Drawing Sheets

(51) Int. Cl.
  *H01L 29/32* (2006.01)
  *H01L 29/34* (2006.01)
  *H01L 29/36* (2006.01)
  *C30B 25/20* (2006.01)
  *C30B 29/36* (2006.01)
  *C30B 33/00* (2006.01)
  *C30B 23/02* (2006.01)
  *H01L 21/66* (2006.01)

(52) U.S. Cl.
  CPC .............. *H01L 29/32* (2013.01); *H01L 29/34* (2013.01); *H01L 29/36* (2013.01); *C30B 23/025* (2013.01); *C30B 25/20* (2013.01); *C30B 29/36* (2013.01); *C30B 33/00* (2013.01); *H01L 21/0262* (2013.01); *H01L 21/02378* (2013.01); *H01L 21/02529* (2013.01); *H01L 22/12* (2013.01)

(58) Field of Classification Search
  CPC ............................... H01L 29/32–29/36; H01L 21/02005–21/02035; H01L 21/02002; H01L 21/02008; H01L 21/0213; H01L 21/02019; H01L 21/02428–21/0243; H01L 29/34; C30B 29/36; C30B 33/00; C30B 23/025; C30B 25/20; C30B 25/186
  See application file for complete search history.

(56) References Cited

U.S. PATENT DOCUMENTS

| | | | | | |
|---|---|---|---|---|---|
| 6,342,433 | B1* | 1/2002 | Ohmi | ............... | H01L 21/76251 257/E21.567 |
| 6,583,050 | B2* | 6/2003 | Wenski | ............... | B24B 37/042 438/626 |
| 8,165,706 | B2* | 4/2012 | Pitney | ............... | G01B 21/30 700/105 |
| 8,340,801 | B2* | 12/2012 | Pitney | ............... | G01B 21/30 700/105 |
| 2003/0038333 | A1* | 2/2003 | Satoh | ............... | H01L 27/095 257/471 |
| 2004/0134418 | A1* | 7/2004 | Hirooka | ............... | C30B 29/36 117/101 |
| 2008/0142846 | A1* | 6/2008 | Kim | ............... | H01L 21/0237 257/200 |
| 2009/0302328 | A1 | 12/2009 | Ohno et al. | | |
| 2009/0317983 | A1 | 12/2009 | Miyanagi et al. | | |
| 2010/0258911 | A1* | 10/2010 | Nakayama | ............ | C30B 25/183 257/615 |
| 2010/0295059 | A1* | 11/2010 | Fujimoto | ............... | C30B 23/00 257/77 |
| 2012/0060751 | A1* | 3/2012 | Urakami | ............... | C30B 23/00 117/106 |
| 2012/0068195 | A1* | 3/2012 | Harada | ............... | C30B 29/36 257/77 |
| 2012/0315427 | A1* | 12/2012 | Hori | ............... | C30B 23/00 428/64.1 |
| 2013/0071643 | A1* | 3/2013 | Harada | ............... | C30B 23/005 428/220 |
| 2013/0126906 | A1* | 5/2013 | Tomita | ............... | C30B 25/02 257/77 |
| 2013/0207159 | A1* | 8/2013 | Vobecky | ............... | H01L 29/0615 257/172 |
| 2014/0027787 | A1* | 1/2014 | Gunjishima | ........... | H01L 29/045 257/77 |
| 2014/0054609 | A1* | 2/2014 | Burk | ............... | H01L 21/3221 257/77 |
| 2014/0117380 | A1* | 5/2014 | Loboda | ............... | H01L 21/30625 257/77 |
| 2014/0206262 | A1 | 7/2014 | Oono | | |
| 2015/0170928 | A1* | 6/2015 | Nakayama | ........ | H01L 21/02013 428/141 |
| 2016/0133465 | A1* | 5/2016 | Sasaki | ............... | B24B 37/08 438/693 |
| 2016/0181375 | A1* | 6/2016 | Horii | ............... | H01L 21/02529 257/77 |
| 2016/0233080 | A1* | 8/2016 | Tanaka | ............... | C30B 29/36 |

FOREIGN PATENT DOCUMENTS

| | | |
|---|---|---|
| JP | 10-081599 | 3/1998 |
| JP | 2005-129629 | 5/2005 |
| JP | 2008-150284 | 7/2008 |
| JP | 2009-295728 | 12/2009 |
| JP | 2010-040607 | 2/2010 |
| JP | 2010-248021 | 11/2010 |
| JP | 2012-151400 | 8/2012 |
| JP | 2014-143247 | 8/2014 |
| WO | 2007/032214 | 3/2007 |
| WO | 2013/021902 | 2/2013 |

* cited by examiner

SILICON CARBIDE SEMICONDUCTOR SUBSTRATE USED TO FORM SEMICONDUCTOR EPITAXIAL LAYER THEREON

BACKGROUND

1. Technical Field

The present disclosure relates to silicon carbide semiconductor substrates.

2. Description of the Related Art

Wide bandgap semiconductors are used in various semiconductor devices such as power devices (power elements), environment resistant devices, high-temperature devices and high-frequency devices. In particular, the application of attention is to power devices such as switching devices and rectifying devices.

Of the wide bandgap semiconductors, silicon carbide (SiC) is relatively easy to form into substrates. Further, the thermal oxidation of this semiconductor material gives silicon dioxide ($SiO_2$) films that are quality gate insulators. These benefits make SiC attractive for use in the development of power devices (see, for example, Japanese Unexamined Patent Application Publication No. 2012-151400).

Some of the typical switching devices using SiC are metal insulator semiconductor field effect transistors (hereinafter, "MISFETs") and metal semiconductor field effect transistors (hereinafter, "MESFETs").

SiC has a higher dielectric breakdown field and a higher thermal conductivity than Si. Thus, power devices using SiC (SiC power devices) can achieve a higher breakdown voltage and a lower power loss than Si power devices. This fact makes it possible to significantly reduce the area and thickness of the SiC power devices as compared to Si power devices having an equal performance, resulting in a decrease in gate electrode-to-substrate parasitic capacitance. Further, SiC has a higher electron saturation speed than Si. These characteristics allow the SiC power devices to be switched at a much higher speed than Si power devices.

Because the coefficient of thermal diffusivity of impurities in SiC is low, it is difficult to control the diffusion of impurities by a thermal method used in other semiconductors such as Si. While ion implantation is used to form relatively shallow impurity layers, gas-phase doping in which a dopant is added during the epitaxial growth of crystal is effective to control the carrier concentration in deep impurity layers such as drift layers in vertical MISFETs. This gas-phase doping is generally performed by a chemical vapor deposition (CVD) method. The CVD method is useful in that the impurity concentration and other properties such as pn junction interface can be controlled and also in that the method can be applied not only to small substrates but also to large substrates.

SiC crystal is conventionally grown with a horizontal CVD apparatus such as one described in Japanese Unexamined Patent Application Publication No. 2010-40607. However, as reported by Xuan Zhang, et al, in Materials Science Forum, Vols. 679-680 (2011), pp. 306-309, the temperature distribution in a wafer gives rise to the occurrence of interfacial dislocations during the epitaxial growth of SiC.

SUMMARY

In one general aspect, the techniques disclosed here feature a silicon carbide semiconductor substrate having a first principal surface and a second principal surface opposite to the first principal surface, the silicon carbide semiconductor substrate comprising: a silicon carbide semiconductor crystal; and a first affected layer having crystal disturbances and disposed under the first principal surface, wherein a thickness of the first affected layer in a first region including a center of the first principal surface is smaller than a thickness of the first affected layer in a second region surrounding the first region in a plane view.

The silicon carbide semiconductor substrates of the present disclosure allow for the formation of semiconductor epitaxial layers with reduced occurrence of interfacial dislocations. A process for producing such silicon carbide semiconductor substrates is also disclosed.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
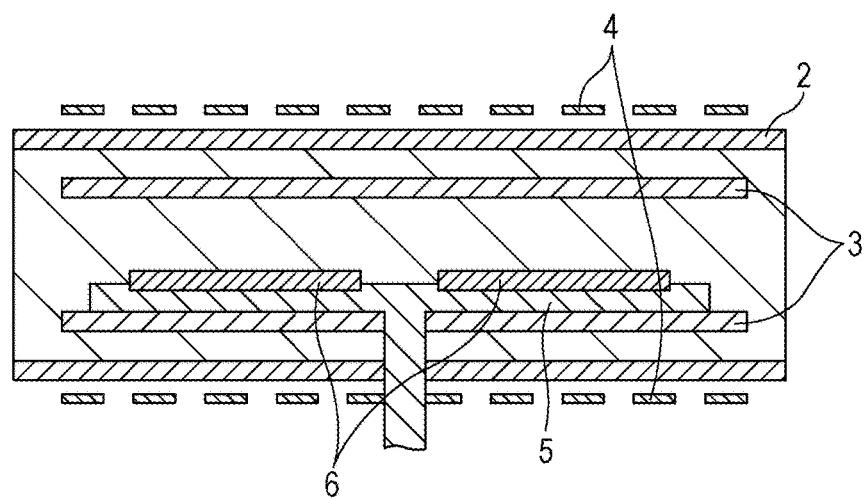
FIG. 1 is a schematic view illustrating a horizontal CVD apparatus used in embodiments of the present disclosure.

To study the mechanism of the occurrence of interfacial dislocations, the present inventor carried out experiments in which SiC layers were epitaxially grown with a horizontal hot wall CVD apparatus illustrated in FIG. 1 in accordance with the disclosure of Japanese Unexamined Patent Application Publication No. 2010-40607. For example, the apparatus may be Probus-SiC manufactured by Tokyo Electron Limited. Silane and propane were used as the raw material gases, and hydrogen as the carrier gas. The apparatus includes a growth chamber 2 made of quartz, a fixed susceptor 3 made of graphite, and a rotational susceptor 5 which is disposed inside the fixed susceptor 3 and supports a wafer(s) 6. The wafer 6 is arranged in a pocket 7 of the rotational susceptor 5. The rotational susceptor 5 is rotatable at 60 rpm by a rotating mechanism. Upon the application of high frequency power to an induction coil 4, the fixed susceptor 3 heats the surface of the wafer 6 to about 1700° C. The experiments involved 4H-SiC wafers having an off angle of 4°, and the front side (the second principal surface) was the Si surface and the backside (the first principal surface) was the C surface.

Figure 2A:
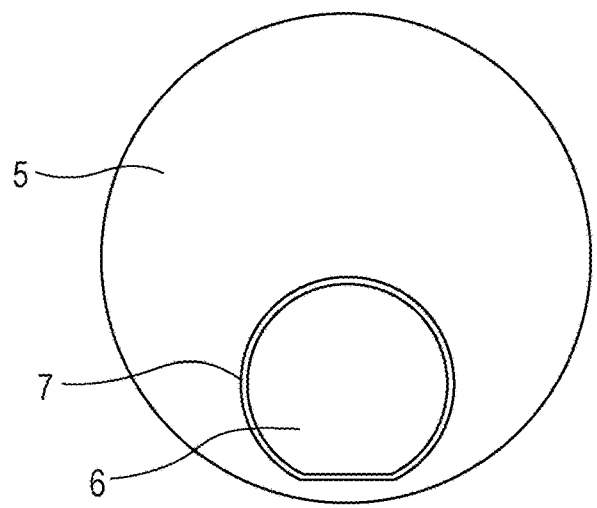
FIG. 2A is a plan view of an arrangement of a 150-mm wafer on a rotational susceptor of the apparatus illustrated in FIG. 1.
Figure 2B:
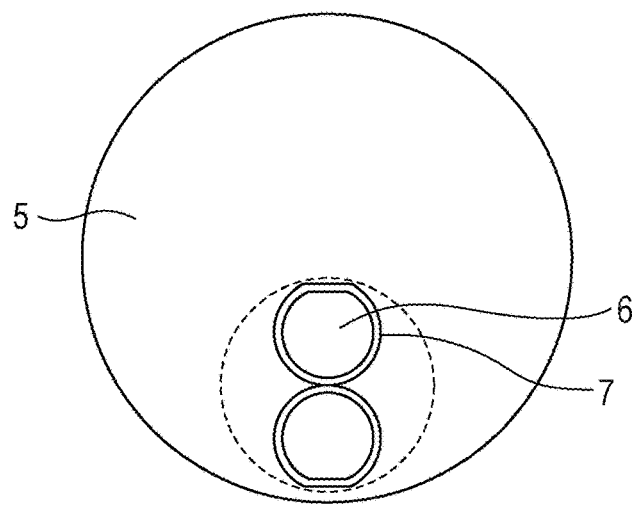
FIG. 2B is a plan view of an arrangement of 3-inch wafers on the rotational susceptor of the apparatus illustrated in FIG. 1.

To study the dependence of the occurrence of interfacial dislocations on the diameter size of the wafer 6, semiconductor layers were grown on a 150-mm wafer and a 3-inch wafer. FIGS. 2A and 2B illustrate the arrangements of the 150-mm wafer and the 3-inch wafers, respectively, on the rotational susceptor 5. To eliminate the dependence on the position in the rotational susceptor 5, two 3-inch wafers were used in the epitaxial growth of a SiC layer as illustrated in FIG. 2B.

Figure 3A:
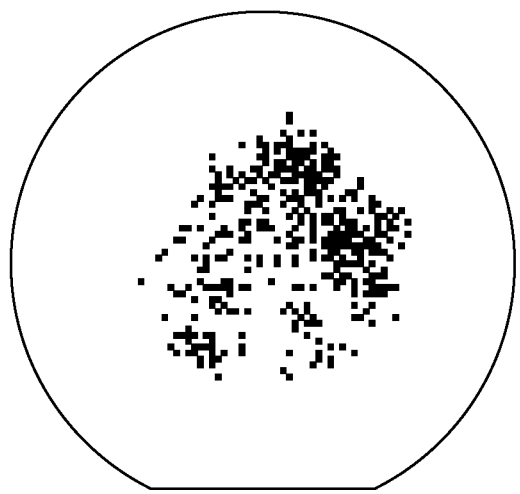
FIG. 3A is a view illustrating a distribution of interfacial dislocations in the 150-mm wafer.
Figure 3B:
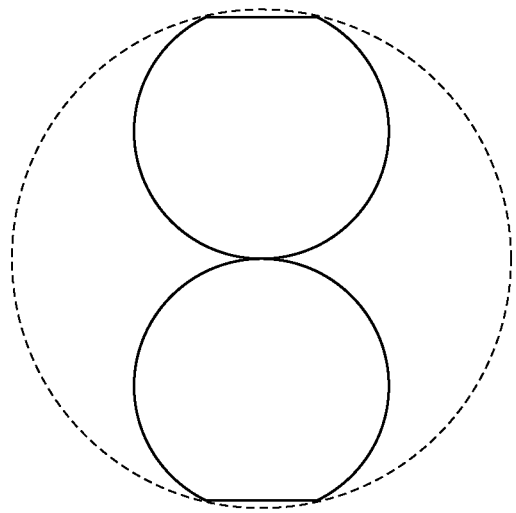
FIG. 3B is a view illustrating a distribution of interfacial dislocations in the 3-inch wafers.

FIGS. 3A and 3B illustrate distributions of interfacial dislocations in the 150-mm wafer and the 3-inch wafers. To evaluate the occurrence of interfacial dislocations, the surface of the epitaxial wafer was soaked in molten KOH to form pits which were characteristic for interfacial dislocations and the number of the pits was counted with a microscope. In the two 3-inch wafers, no interfacial dislocations were found in the entire regions of the wafers. On the other hand, a large number of interfacial dislocations were found near the center of the 150-mm wafer. The number of interfacial dislocations that had occurred on the 150-mm wafer was 450. Based on these results, the present inventor has reached a novel finding that the occurrence of interfacial dislocations is a new challenge associated with increasing of the wafer diameter.

Figure 4:
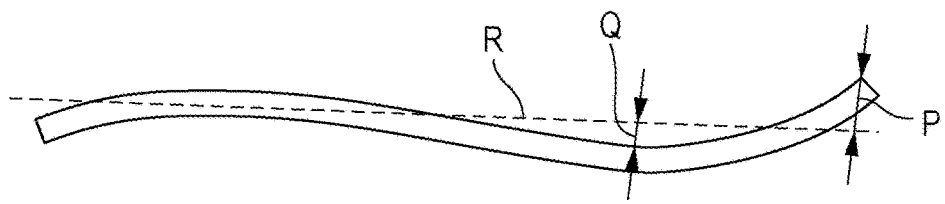
FIG. 4 is a view that defines SORI.

Next, the present inventor studied the relationship between the amount of SORI in a wafer and the occurrence of interfacial dislocations. The term "SORI" will be defined with reference to FIG. 4. First, a wafer is analyzed to determine the surface roughness on the front side or the backside. Specifically, the surface heights distributed on the front side or the backside of the wafer are measured, and the results are analyzed by a least squares method to determine the reference plane R. Next, the distance P from the reference plane R to the highest point and the distance Q from the reference plane R to the lowest point are measured. Lastly, the absolute values of the distances P and Q are combined to give the amount of SORI. While other terms such as bowing and warpage are used to represent the degree of curvature of wafers, relatively simple deformation of wafers can be expressed with SORI similarly to such indicators.

Figure 5:
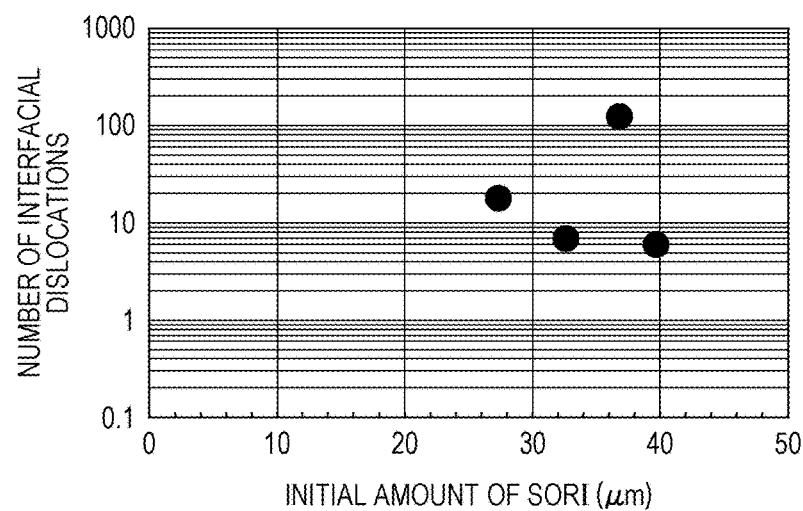
FIG. 5 is a diagram illustrating relationships between the initial amount of SORI present before epitaxial growth and the number of interfacial dislocations present after the epitaxial growth.
Figure 6:
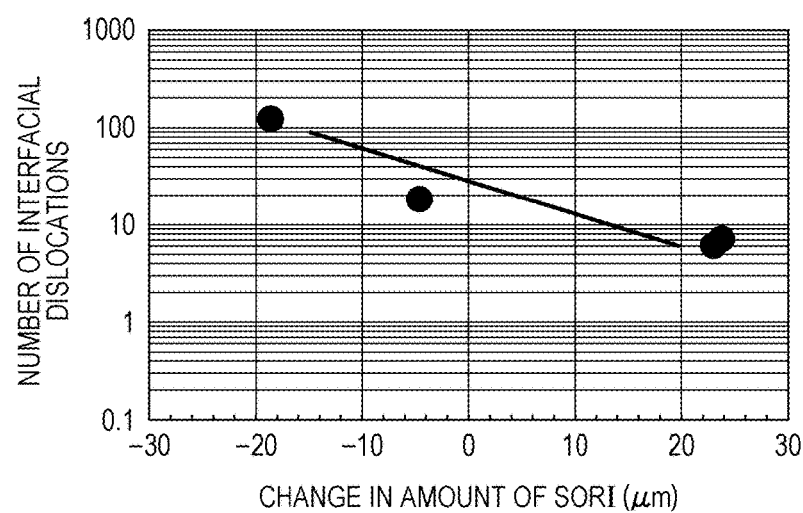
FIG. 6 is a diagram illustrating relationships between the change in the amount of SORI before and after the epitaxial growth and the number of interfacial dislocations.

To study the relationship between the amount of SORI and the occurrence of interfacial dislocations, four types of wafers were provided which had different amounts of SORI present before epitaxial growth. FIG. 5 illustrates relationships between the initial amount of SORI present before epitaxial growth and the number of interfacial dislocations present after the epitaxial growth. FIG. 6 illustrates relationships between the change in the amount of SORI before and after the epitaxial growth and the number of interfacial dislocations. In the figures, positive initial amounts of SORI and positive changes in the amount of SORI mean that the backside of the wafer is outwardly curved. Positive changes in the amount of SORI mean that the wafer is warped to a greater degree, while negative changes in the amount of SORI indicate that the warpage of the wafer is decreased and the wafer surface is close to being flat.

As clear from FIG. 5, there are no correlations between the initial amount of SORI and the amount of the occurrence of interfacial dislocations. On the other hand, FIG. 6 shows that the number of interfacial dislocations is correlated with the change in the amount of SORI. The number of interfacial dislocations is shown to decrease when the change in the amount of SORI is positive, namely, when the wafer is warped to a greater degree so that the top of the outward curve on the backside of the wafer is elevated. This phenomenon was first revealed by the present inventor. Based on the results, the occurrence of interfacial dislocations may be reduced by ensuring that the change in the amount of SORI is positive and large.

Figure 7:
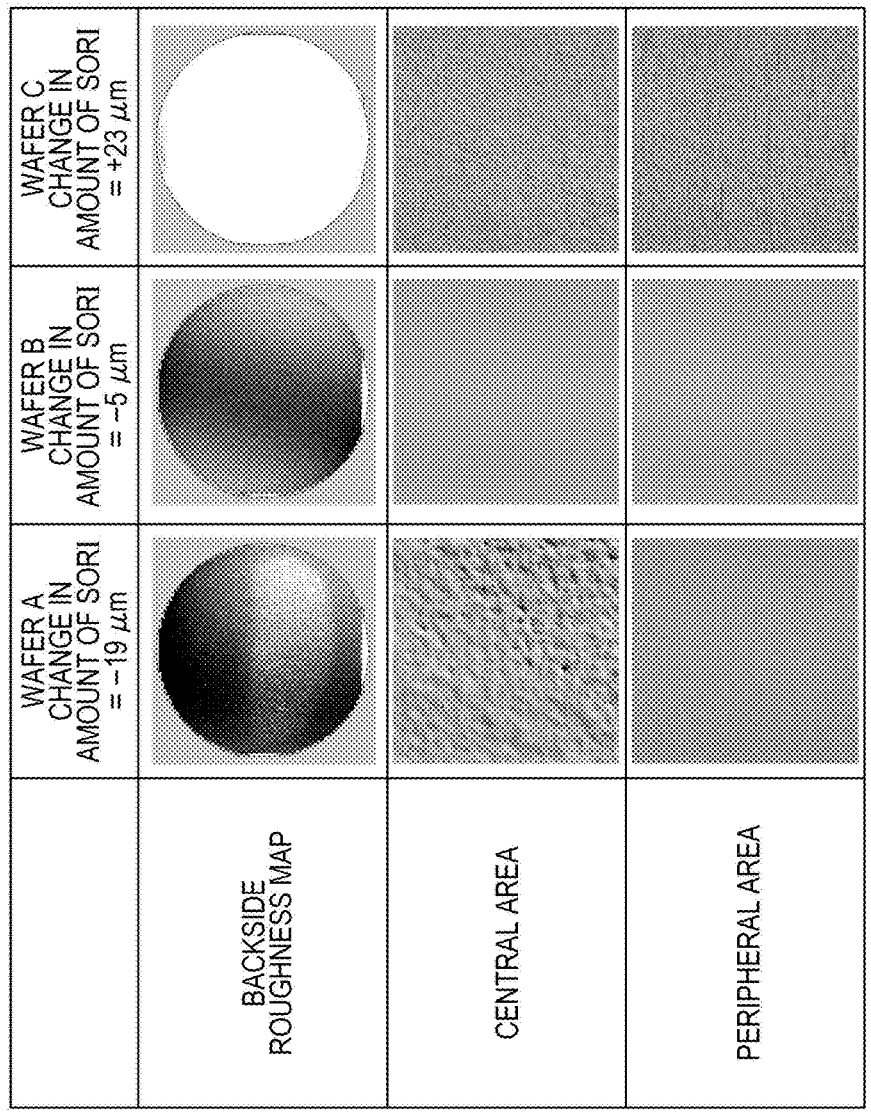
FIG. 7 is a set of maps of roughness on the backsides of wafers having different changes in the amount of SORI, and micrographs of central areas and peripheral areas of the wafers.

Next, the front sides and the backsides of wafers A, B and C were observed to identify the cause that gave rise to a variation in the change in the amount of SORI. While the wafers A, B and C were confirmed to have a similar surface condition on the front side, the surface conditions of the backsides of the wafers A, B and C were very different. FIG. 7 shows the results obtained by analyzing the backsides of the wafers A, B and C having different changes in the amount of SORI, with use of a confocal differential interference microscope (SICA-6X (manufactured by Lasertec Corporation). The analysis results set forth in FIG. 7 are roughness maps and micrographs of central areas and peripheral areas of the wafers. In the surface roughness maps, rough areas are indicated in white and flat areas are shown in black. FIG. 7 shows that the variation in the change in the amount of SORI among the wafers A, B and C is dependent on the backside roughness. Specifically, the wafer C, which had a large positive change in the amount of SORI, was shown to have a large roughness over the entirety of the backside. The micrograph showed that the backside of the wafer C had a large number of flaw-like structures. The backside of the wafer B having a small change in the amount of SORI was found to be flat over the entirety thereof. On the other hand, the backside of the wafer A having a large negative change in the amount of SORI had a roughness distribution in the plane of the wafer. More specifically, the peripheral area of the wafer was flat but the central area of the wafer had a large roughness. FIG. 7 shows that the central area of the backside of the wafer A had a large number of seemingly relatively smooth irregularities in contrast to the central area of the wafer C.

The backside profiles of the wafers A, B and C, and the variation in the change in the amount of SORI are dependent on how the wafers have been processed. The wafer A was produced by grinding the front side and the backside of a workpiece cut from boule by relatively small amounts. Assuming that a device would be formed on the front side, the front side was polished sufficiently to enhance its flatness. On the other hand, the amount of polishing on the backside was minimum. The wafer A has a large thickness distribution, with the thickness being large in the peripheral area and small in the central area. Because of this shape, the central area of the backside of the wafer A is away from contact with an abrasive cloth during chemical mechanical polishing (CMP) and the processing of the central area on the backside is dominantly made by chemical etching of the affected layer. As a result, the central area of the backside of the wafer A has large irregularities but the thickness of the affected layer in the central area is small. While the CMP on the front side leaves a slight amount of an affected layer, the central area of the backside is cleared of the affected layer by chemical reaction and consequently the thickness of the affected layer in the area is smaller than that on the front side.

The wafer B was produced by grinding the front side and the backside of a workpiece cut from boule to sufficient flatness, followed by sufficient CMP. As a result, the front side and the backside of the wafer B are flat over the entire surface. The CMP in this case also leaves slight amounts of affected layers on the wafer.

The wafer C was produced by grinding a workpiece cut from boule to sufficient flatness. The amount of CMP on the backside is small. As a result, a large proportion of the affected layer formed by the grinding still remains on the backside of the wafer C.

Figure 8A:
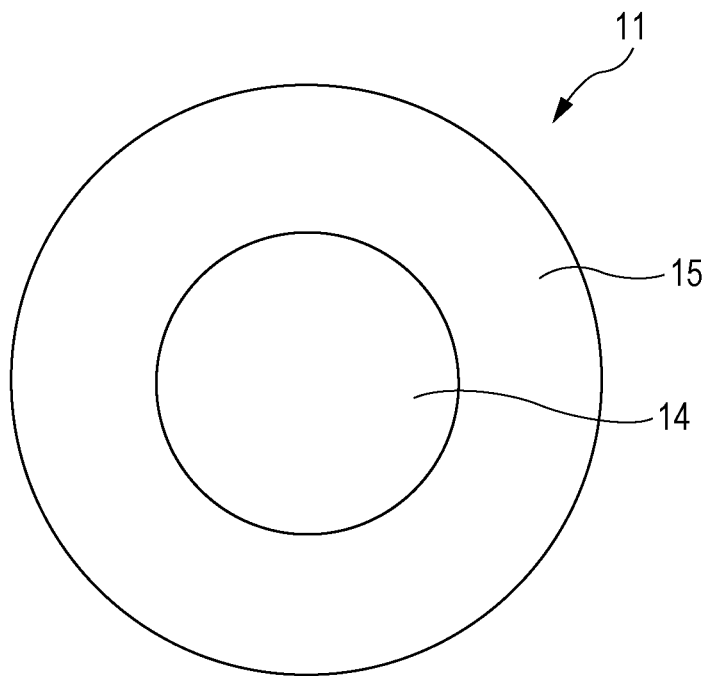
FIG. 8A is a bottom view that defines regions of a silicon carbide semiconductor substrate in the present disclosure.
Figure 8B:
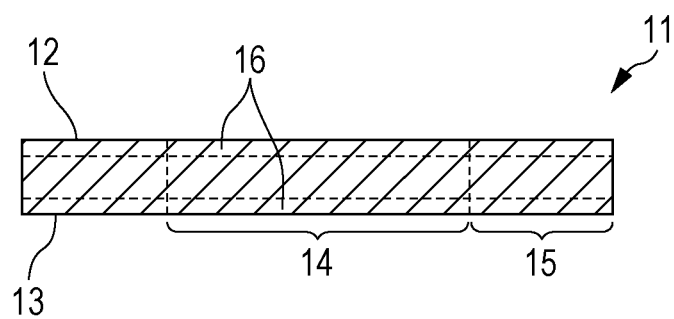
FIG. 8B is a sectional view that defines regions of a silicon carbide semiconductor substrate in the present disclosure.
Figure 9A:
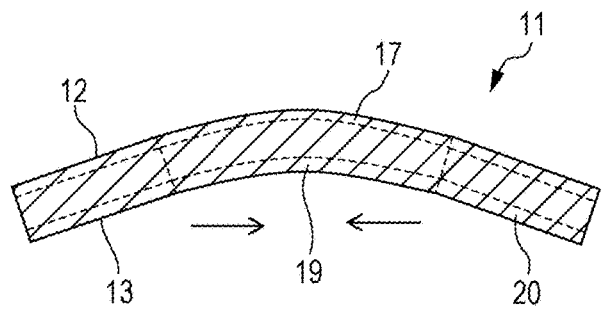
FIG. 9A is a schematic sectional view of the wafer A described in FIG. 7 after the formation of a semiconductor epitaxial layer on the wafer A wherein the drawing omits the semiconductor epitaxial layer.
Figure 9B:
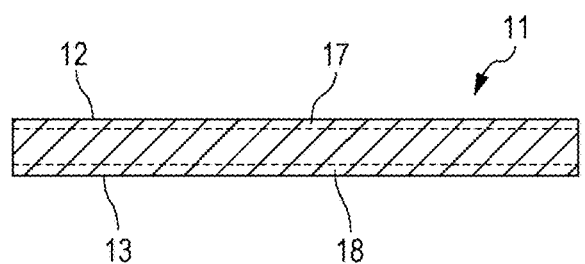
FIG. 9B is a schematic sectional view of the wafer B described in FIG. 7 after the formation of a semiconductor epitaxial layer on the wafer B wherein the drawing omits the semiconductor epitaxial layer.
Figure 9C:
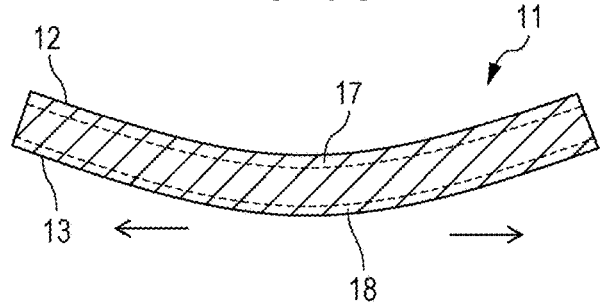
FIG. 9C is a schematic sectional view of the wafer C described in FIG. 7 after the formation of a semiconductor epitaxial layer on the wafer C wherein the drawing omits the semiconductor epitaxial layer.

Next, the reasons will be discussed why the change in the amount of SORI is varied depending on the backside profile and the manner in which the wafer is processed. First, regions of a wafer will be defined with reference to FIGS. 8A and 8B. FIGS. 8A and 8B are a bottom view and a sectional view, respectively, of a silicon carbide semiconductor substrate 11. For the purpose of facilitating the explanation, the description with reference to FIG. 7 has illustrated wafers having a small amount of SORI present before epitaxial growth, in other words, flat wafers. As mentioned hereinabove, the actual wafer profiles shown in FIGS. 5 and 6 have a downwardly curved shape before the wafers are subjected to epitaxial growth. The silicon carbide semiconductor substrate 11 has a first principal surface 13 and a second principal surface 12 opposite to the first principal surface 13. The first principal surface 13 has a first region 14 including the center of the first principal surface 13, and a second region 15 surrounding the first region 14. Underneath the first principal surface 13 and the second principal surface 12, the silicon carbide semiconductor substrate 11 includes affected layers 16 formed during the production of the silicon carbide semiconductor substrate 11. FIGS. 9A, 9B and 9C are schematic sectional views of the wafers A, B and C described in FIG. 7, respectively, after epitaxial growth. Although not illustrated, a semiconductor epitaxial layer is disposed on the second principal surface 12.

In the presence of the affected layers under the first principal surface 13 and the second principal surface 12 of the silicon carbide semiconductor substrate 11, the silicon carbide semiconductor substrate 11 is warped so that one of the first principal surface 13 and the second principal surface 12 is outwardly curved depending on the balance of factors such as thickness. This influence of the affected layers on the deformation of the silicon carbide semiconductor substrate is known as the Twyman effect. In the Twyman effect, the silicon carbide semiconductor substrate is bent to a greater extent with increasing magnitude of the damage caused by processing of the silicon carbide semiconductor substrate. Specifically, the shape of the silicon carbide semiconductor substrate 11 is determined by the balance of the stresses exerted by the affected layers 16 on both sides of the silicon carbide semiconductor substrate 11.

The affected layers are portions which have crystal disturbances such as distortions in the silicon carbide semiconductor crystal constituting the silicon carbide semiconductor substrate. Such crystal disturbances are caused by the force applied by a platen and a polishing pad during grinding or polishing of the first principal surface 13 and the second principal surface 12 of the silicon carbide semiconductor substrate 11. In general, affected layers are associated with the surface roughness of a first principal surface and a second principal surface of a silicon carbide semiconductor substrate. Specifically, the surface roughness is higher with increasing thickness of the affected layers.

The wafer A illustrated in FIG. 9A has a large negative change in the amount of SORI. The wafer A illustrated in FIG. 9A is such that the thickness of a first affected layer 19 disposed in the first region 14 is smaller than the thickness of a second affected layer 17 under the second principal surface 12 and the thickness of a first affected layer 20 disposed in the second region 15, or such that the linear density of crystal disturbances in the first affected layer 19 in the first region 14 is lower than the linear density of crystal disturbances in the second affected layer 17 under the second principal surface 12 and that in the first affected layer 20 in the second region 15.

The thickness or the linear density of crystal disturbances is substantially the same between the second affected layer 17 under the second principal surface 12 and the first affected layer 20 in the second region 15. Thus, the stresses of the affected layers are balanced between the second region 15 and the region of the second principal surface 12 opposite to the second region 15. On the other hand, the first region 14 and the region of the second principal surface 12 opposite to the first region 14 are such that the first affected layer 19 in the first region 14 has a smaller thickness or a lower linear density of crystal disturbances than the second affected layer 17 under the second principal surface 12. Thus, as illustrated in FIG. 9A, a compressive (shrinking) stress is produced in the first region 14 of the silicon carbide semiconductor substrate 11 so that the silicon carbide semiconductor substrate 11 has a negative change in the amount of SORI.

Next, the wafer B illustrated in FIG. 9B will be discussed. The wafer B has a small change in the amount of SORI. In the wafer B illustrated in FIG. 9B, the second affected layer 17 under the second principal surface 12 and the first affected layer 18 under the first principal surface 13 have a similar thickness and a similar linear density of crystal disturbances over the entirety of the second principal surface 12 and the entirety of the first principal surface 13. Consequently, the wafer B illustrated in FIG. 9B exhibits a small change in the amount of SORI.

The wafer C illustrated in FIG. 9C has a large positive change in the amount of SORI. In the wafer C illustrated in FIG. 9C, the thickness of the first affected layer 18 under the first principal surface 13 is larger than the thickness of the second affected layer 17 under the second principal surface 12. As a result, the first region 14 undergoes a tensile stress so that the wafer C exhibits a positive change in the amount of SORI.

Figure 10:
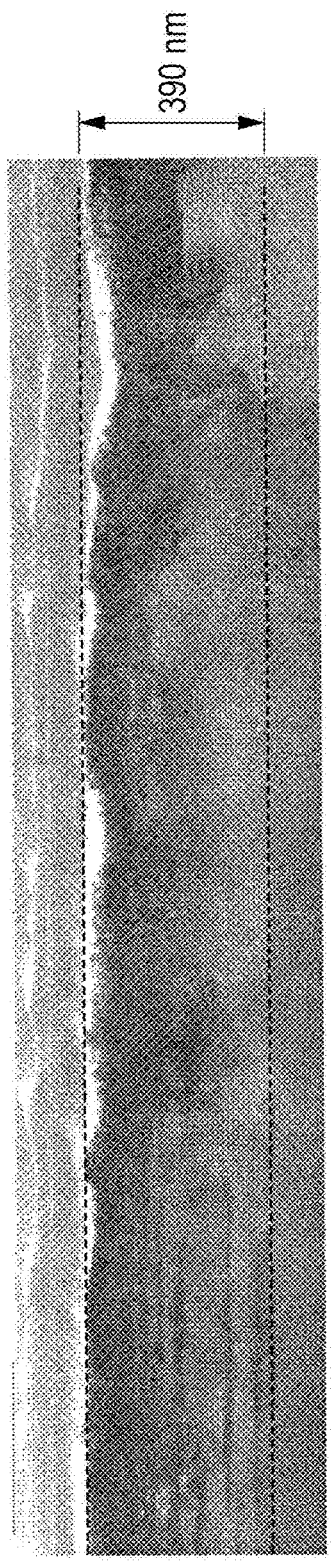
FIG. 10 is a transmission electron micrograph of the backside of the wafer C.

FIG. 10 is an exemplary transmission electron micrograph of the first affected layer 18 under the first principal surface 13 of the wafer C. As shown in the micrograph, crystal disturbances exist with a maximum depth of 390 nm from the level of the first principal surface 13. The crystal disturbances define the affected layer. In particular, the affected layer was found to contain the crystal disturbances in a linear density of 200 disturbances/mm in a deep area from the level of the first principal surface 13.

Figure 11:
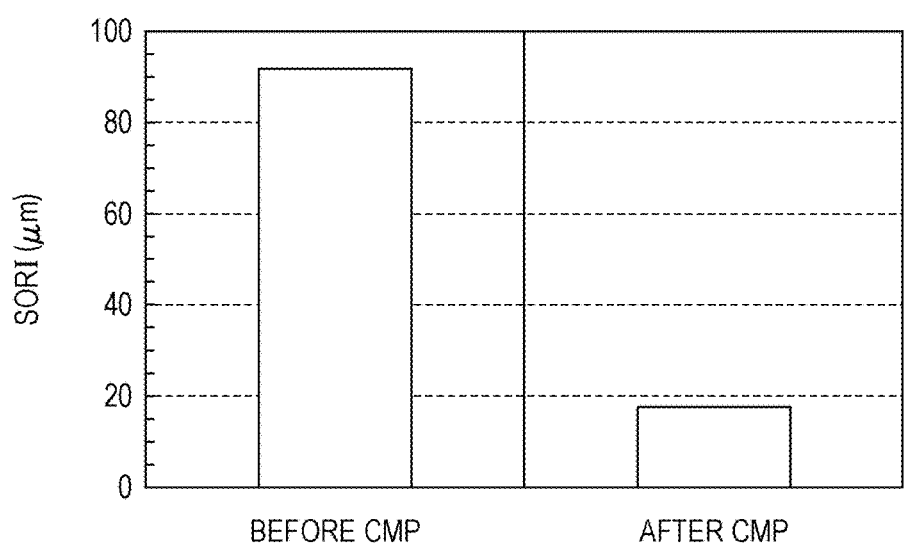
FIG. 11 is a diagram that compares the amounts of SORI before and after backside CMP.

As discussed above, the results of the studies carried out by the present inventor have shown that the change in the amount of SORI may be controlled by manipulating the balance between the thicknesses and the linear densities of crystal disturbances of the affected layers on the front side and the backside. The presence of a large amount of SORI after epitaxial growth can cause problems during the subsequent production steps such as during the conveyance of the devices. To prevent such problems, the amount of SORI in the silicon carbide semiconductor substrate may be reduced. FIG. 11 compares the amount of SORI present after epitaxial growth to the amount of SORI present after at least part of the affected layer on the backside has been removed by CMP. The thickness of the backside affected layer removed is 5 µm. The diagram shows that even when the silicon carbide semiconductor substrate has a large amount of SORI present after epitaxial growth, the amount of SORI may be reduced by removing the backside affected layer.

Based on the results discussed above, the change in the amount of SORI occurring during epitaxial growth may be controlled by manipulating the balance of the stresses exerted by the affected layers on the front side and the backside. Further, the amount of SORI present after epitaxial growth on the silicon carbide semiconductor substrate may be reduced by removing the backside affected layer.

The aforementioned relationship between the occurrence of interfacial dislocations and the change in the amount of SORI was first found by the present inventor. Based on the relationship, the present inventor has developed a silicon carbide semiconductor substrate which allows a semiconductor layer to be grown thereon while suppressing the occurrence of interfacial dislocations, and has also developed a process for producing such silicon carbide semiconductor substrates.

The general aspects of the present disclosure reside in the silicon carbide semiconductor substrates and processes for producing such substrates described below.

[Item 1]

A silicon carbide semiconductor substrate having a first principal surface and a second principal surface opposite to the first principal surface, the silicon carbide semiconductor substrate comprising: a silicon carbide semiconductor crystal; and a first affected layer having crystal disturbances and disposed under the first principal surface, wherein a thickness of the first affected layer in a first region including a center of the first principal surface is smaller than a thickness of the first affected layer in a second region surrounding the first region in a plane view. The first affected layer may be in contact with the first principal surface.

With this configuration, the formation of a semiconductor epitaxial layer on the second principal surface results in the inward bending of the second principal surface so that a large positive change in the amount of SORI is produced in the second principal surface. In this manner, the occurrence of interfacial dislocations in the semiconductor epitaxial layer is suppressed.

[Item 2]

The silicon carbide semiconductor substrate described in Item 1, further comprising a second affected layer having crystal disturbances and disposed under the second principal surface, wherein the thickness of the first affected layer in the first region and the thickness of the first affected layer in the second region are both larger than a thickness of the second affected layer. The second affected layer may be in contact with the second principal surface.

[Item 3]

The silicon carbide semiconductor substrate described in Item 1 or 2, wherein the thickness of the first affected layer in the second region is 390 nm or more.

The above configuration ensures that a large positive change in the amount of SORI is produced more reliably in the second principal surface upon the formation of a semiconductor epitaxial layer, and consequently the occurrence of interfacial dislocations in the semiconductor epitaxial layer is suppressed more efficiently.

[Item 4]

A silicon carbide semiconductor substrate having a first principal surface and a second principal surface opposite to the first principal surface, the silicon carbide semiconductor substrate comprising: a silicon carbide semiconductor crystal; and a first affected layer having crystal disturbances and disposed under the first principal surface, wherein a linear density of crystal disturbances in the first affected layer in a first region including a center of the first principal surface is lower than a linear density of crystal disturbances in the first affected layer in a second region surrounding the first region in a plane view. The first affected layer may be in contact with the first principal surface.

With this configuration, the formation of a semiconductor epitaxial layer on the second principal surface results in the inward bending of the second principal surface so that a large positive change in the amount of SORI is produced in the second principal surface. In this manner, the occurrence of interfacial dislocations in the semiconductor epitaxial layer is suppressed.

[Item 5]

The silicon carbide semiconductor substrate described in Item 4, further comprising a second affected layer having crystal disturbances and disposed under the second principal surface, wherein the linear density of the crystal disturbances in the first affected layer in the first region and the linear density of the crystal disturbances in the first affected layer in the second region are both higher than a linear density of crystal disturbances in the second affected layer. The second affected layer may be in contact with the second principal surface.

[Item 6]

The silicon carbide semiconductor substrate described in Item 4 or 5, wherein the linear density of the crystal disturbances in the first affected layer in the second region is 200 disturbances/mm or more.

The above configuration ensures that a large positive change in the amount of SORI is produced more reliably in the second principal surface upon the formation of a semiconductor epitaxial layer, and consequently the occurrence of interfacial dislocations in the semiconductor epitaxial layer is suppressed more efficiently.

[Item 7]

A silicon carbide semiconductor substrate having a first principal surface and a second principal surface opposite to the first principal surface, the silicon carbide semiconductor substrate comprising: a recess surrounding a first region including a center of the first principal surface in a plane view, wherein a thickness of the silicon carbide semiconductor substrate in the recess is smaller than a thickness of the silicon carbide semiconductor substrate in the first region.

With this configuration, the formation of a semiconductor epitaxial layer on the second principal surface results in a deformation that is mainly the outward bending of the first region of the first principal surface so that a large positive change in the amount of SORI is produced in the second principal surface. In this manner, the occurrence of interfacial dislocations in the semiconductor epitaxial layer is suppressed.

[Item 8]

The silicon carbide semiconductor substrate described in Item 7, further comprising: a silicon carbide semiconductor crystal; and a first affected layer having crystal disturbances which is disposed under the first principal surface, wherein a thickness of the first affected layer in the first region is smaller than a thickness of the first affected layer in the recess.

[Item 9]

The silicon carbide semiconductor substrate described in Item 8, wherein the thickness of the first affected layer in the recess is 390 nm or more.

[Item 10]

The silicon carbide semiconductor substrate described in Item 7, further comprising: a silicon carbide semiconductor crystal; and a first affected layer having crystal disturbances and disposed under the first principal surface, wherein a linear density of crystal disturbances in the first affected layer in the first region is lower than a linear density of crystal disturbances in the first affected layer in the recess. The first affected layer may be in contact with the first principal surface.

[Item 11]

The silicon carbide semiconductor substrate described in Item 10, wherein the linear density of the crystal disturbances in the first affected layer in the recess is 200 disturbances/mm or more.

[Item 12]

A process for producing a silicon carbide semiconductor substrate including providing a silicon carbide semiconductor substrate workpiece including a silicon carbide semiconductor crystal, the silicon carbide semiconductor substrate workpiece having a first principal surface and a second principal surface opposite to the first principal surface, the first principal surface including a first region including the center of the first principal surface and a second region surrounding the first region, and forming a first affected layer having crystal disturbances under the first principal surface by mechanically processing partially the second region of the first principal surface, the thickness of the first affected layer in the first region being smaller than the thickness of the first affected layer in the second region.

With this configuration, the formation of a semiconductor epitaxial layer on the second principal surface results in the inward bending of the second principal surface so that a large positive change in the amount of SORI is produced in the second principal surface. Thus, the process can produce a silicon carbide semiconductor substrate that allows a semiconductor epitaxial layer to be formed on the second principal surface while preventing the occurrence of interfacial dislocations in the semiconductor epitaxial layer.

[Item 13]

A process for producing a silicon carbide semiconductor substrate including providing a silicon carbide semiconductor substrate workpiece including a silicon carbide semiconductor crystal, the silicon carbide semiconductor substrate workpiece having a first principal surface and a second principal surface opposite to the first principal surface, the first principal surface including a first region including the center of the first principal surface and a second region surrounding the first region, and forming a first affected layer having crystal disturbances under the first principal surface by mechanically processing partially the second region of the first principal surface, the linear density of crystal disturbances in the first affected layer in the first region being lower than the linear density of crystal disturbances in the first affected layer in the second region.

With this configuration, the formation of a semiconductor epitaxial layer on the second principal surface results in the inward bending of the second principal surface so that a large positive change in the amount of SORI is produced in the second principal surface. Thus, the process can produce a silicon carbide semiconductor substrate that allows a semiconductor epitaxial layer to be formed on the second principal surface while preventing the occurrence of interfacial dislocations in the semiconductor epitaxial layer.

[Item 14]

The process for producing a silicon carbide semiconductor substrate described in Item 12 or 13, further including removing at least part of the first affected layer in the first region.

[Item 15]

A process for producing a silicon carbide semiconductor substrate including providing a silicon carbide semiconductor substrate workpiece including a silicon carbide semiconductor crystal, the silicon carbide semiconductor substrate workpiece having a first principal surface and a second principal surface opposite to the first principal surface, the first principal surface including a first region including the center of the first principal surface and a second region surrounding the first region, and polishing the second region of the first principal surface, the thickness of the silicon carbide semiconductor substrate in the second region being smaller than the thickness of the silicon carbide semiconductor substrate in the first region.

With this configuration, the formation of a semiconductor epitaxial layer on the second principal surface results in a deformation that is mainly the outward bending of the first region of the first principal surface so that a large positive change in the amount of SORI is produced in the second principal surface. Thus, the process can produce a silicon carbide semiconductor substrate that allows a semiconductor epitaxial layer to be formed on the second principal surface while preventing the occurrence of interfacial dislocations in the semiconductor epitaxial layer.

[Item 16]

The process for producing a silicon carbide semiconductor substrate described in any of Items 12 to 15, further including forming a semiconductor epitaxial layer on the second principal surface of the silicon carbide semiconductor substrate, and removing at least part of the first affected layer in the first region and the second region of the first principal surface of the silicon carbide semiconductor substrate.

Hereinbelow, embodiments of the silicon carbide semiconductor substrates and the processes for producing the substrates according to the present disclosure will be described in detail. The embodiments discussed below are only illustrative and do not limit the scope of the present disclosure.

First Embodiment

Figure 12A:
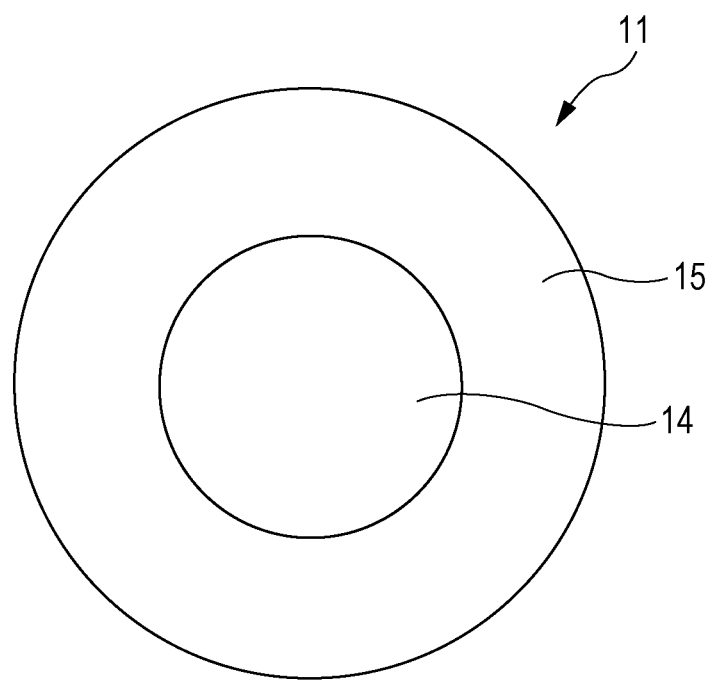
FIG. 12A is a bottom view illustrating a silicon carbide semiconductor substrate of a first embodiment.
Figure 12B:
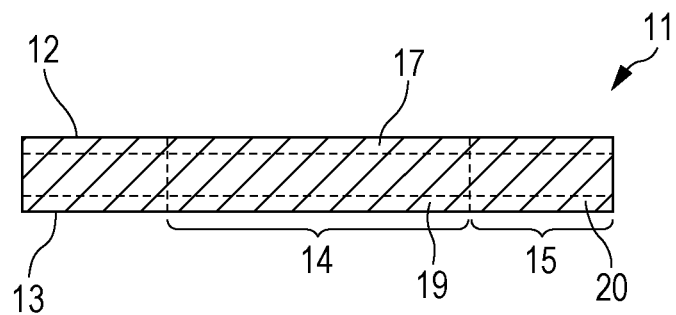
FIG. 12B is a sectional view of the silicon carbide semiconductor substrate of the first embodiment.

The first embodiment of the present disclosure will be described with reference to the drawings. FIGS. 12A and 12B are a bottom view and a sectional view, respectively, of a silicon carbide semiconductor substrate 11 of the present disclosure. The silicon carbide semiconductor substrate 11 has a first principal surface 13 and a second principal surface 12 opposite to the first principal surface 13. The first principal surface 13 includes at least two regions. Specifically, the first principal surface 13 has a first region 14 including the center of the first principal surface 13, and a second region 15 disposed outside the first region 14 so as to surround the first region 14.

A first affected layer 19 is disposed under the first principal surface 13 in the first region 14, and a first affected layer 20 is disposed under the first principal surface 13 in the second region 15. The thickness of the first affected layer 20 in the second region 15 is larger than the thickness of the first affected layer 19 in the first region 14, and the thickness of the first affected layer 19 in the first region 14 and that of the first affected layer 20 in the second region 15 are both larger than the thickness of a second affected layer 17 under the second principal surface 12.

Alternatively, the configuration may be such that the linear density of crystal disturbances in the first affected layer 20 in the second region 15 is higher than the linear density of crystal disturbances in the first affected layer 19 in the first region 14, and the linear density of crystal disturbances in the first affected layer 19 in the first region 14 and that in the first affected layer 20 in the second region 15 are both higher than the linear density of crystal disturbances in the second affected layer 17 under the second principal surface 12.

In other words, the thickness of a crystallographically disturbed surface portion in the second region 15 is larger than the thickness of a crystallographically disturbed surface portion in the first region 14, and the thicknesses of the crystallographically disturbed surface portions in the first and second regions 14 and 15 are both larger than the thickness of a crystallographically disturbed surface portion under the second principal surface 12. Alternatively, the configuration may be such that the linear density of crystal disturbances in a surface portion in the second region 15 is higher than the linear density of crystal disturbances in a surface portion in the first region 14, and the linear densities of crystal disturbances in the surface portions in the first and second regions 14 and 15 are both higher than the linear density of crystal disturbances in a surface portion under the second principal surface 12. For example, the first affected layer 20 in the second region 15 has a thickness of 390 nm or more, and a linear density of crystal disturbances of 200 disturbances/Rim or more.

The thickness of the crystallographically disturbed portion, namely, the thickness of the affected layer may be measured by observing a cross section of the silicon carbide semiconductor substrate with a transmission electron microscope. The linear density of crystal disturbances in the affected layer may be determined by dividing the number of crystal disturbances in a cross section of the silicon carbide semiconductor substrate observed with a transmission electron microscope, by the width of the region observed.

Figure 13:
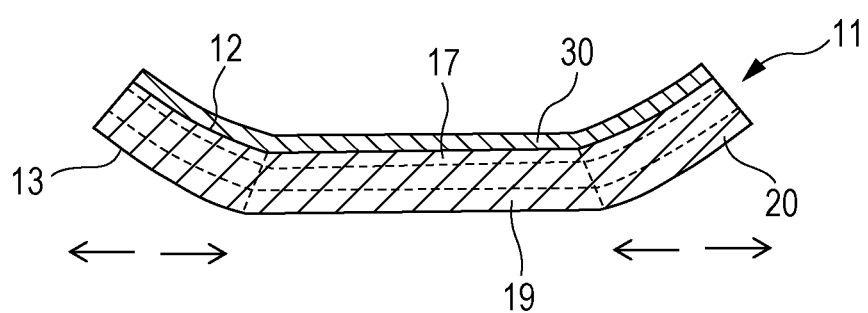
FIG. 13 is a schematic sectional view of the silicon carbide semiconductor substrate of the first embodiment after the formation of a semiconductor epitaxial layer.

FIG. 13 illustrates how the silicon carbide semiconductor substrate 11 of the present disclosure shown in FIGS. 12A and 12B is deformed upon the formation of a semiconductor epitaxial layer 30. In general, the thicknesses of affected layers remaining on the principal surfaces of a silicon carbide semiconductor substrate are small in order to ensure that the semiconductor characteristics of a semiconductor device formed on the principal surface will not be deteriorated due to the presence of crystal disturbances. In contrast, as described hereinabove, the first affected layer 20 in the second region 15 has a larger thickness than the first affected layer 19 in the first region 14, or the first affected layer 20 in the second region 15 has a higher linear density of crystal disturbances than the first affected layer 19 in the first region 14. With this configuration, the difference in properties between the affected layers under the first and second principal surfaces 13 and 12 produces a larger stress in the second region 15 than in the first region 14. Thus, the second region 15 is subjected to a larger stress than the first region 14 by the formation of the semiconductor epitaxial layer 30 on the second principal surface 12. As a result, the formation of the semiconductor epitaxial layer 30 results in a deformation of the silicon carbide semiconductor substrate 11 in such a manner that the second principal surface 12 is inwardly bent as illustrated in FIG. 13. As described hereinabove with reference to FIGS. 6 and 7, this deformation gives rise to a large positive change in the amount of SORI in the second principal surface 12. In this manner, the semiconductor epitaxial layer 30 may be formed on the second principal surface 12 while preventing the occurrence of interfacial dislocations.

When a need arises to reduce the amount of SORI in the silicon carbide semiconductor substrate 11 carrying the semiconductor epitaxial layer 30, at least part of the first affected layer 19 and at least part of the first affected layer 20 disposed under the first principal surface 13 may be removed by a polishing method such as CMP after the formation of the semiconductor epitaxial layer 30. This removal decreases the stress exerted by the first affected layer 19 and the first affected layer 20, thereby reducing the amount of SORI. As a result, the flatness on the surface of the semiconductor epitaxial layer 30 may be enhanced. Because interfacial dislocations occur in the semiconductor epitaxial layer 30 during the formation of the semiconductor epitaxial layer 30, the above removal treatment after the formation of the semiconductor epitaxial layer 30 can reduce the amount of SORI without giving rise to the occurrence of new interfacial dislocations in the semiconductor epitaxial layer 30.

Second Embodiment

Figure 14A:
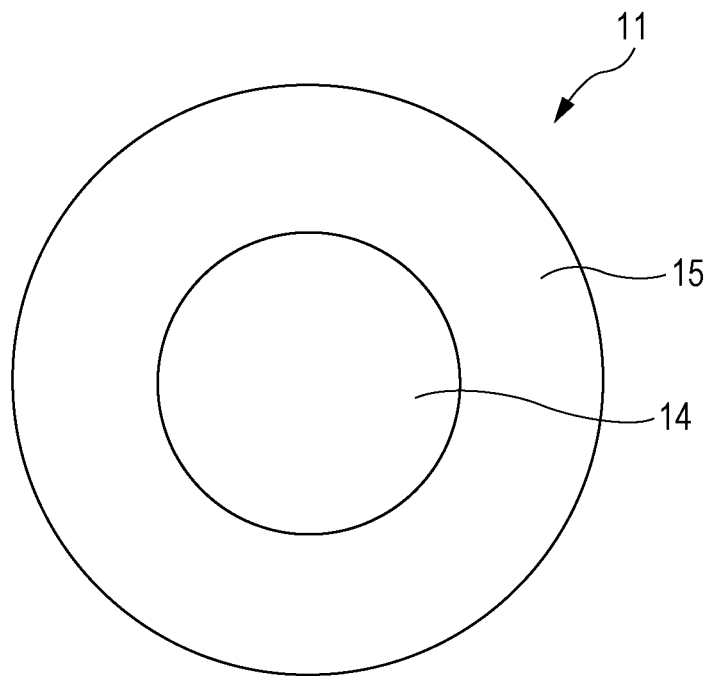
FIG. 14A is a bottom view illustrating a silicon carbide semiconductor substrate of a second embodiment.
Figure 14B:
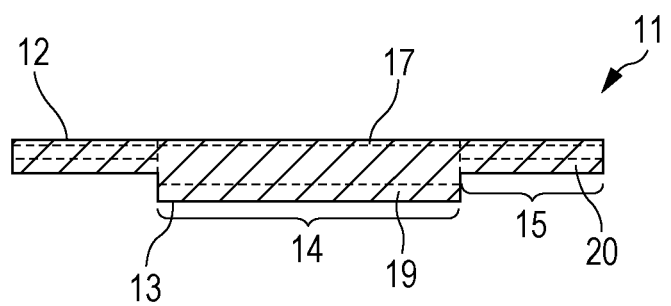
FIG. 14B is a sectional view of the silicon carbide semiconductor substrate of the second embodiment.

The second embodiment of the present disclosure will be described with reference to the drawings. FIGS. 14A and 14B are a bottom view and a sectional view, respectively, of a silicon carbide semiconductor substrate 11 of the present disclosure. The silicon carbide semiconductor substrate 11 has a first principal surface 13 and a second principal surface 12 opposite to the first principal surface 13. The first principal surface 13 includes at least two regions. Specifically, the first principal surface 13 has a first region 14 including the center of the first principal surface 13, and a second region 15 disposed outside the first region 14 so as to surround the first region 14. The second region 15 in the present embodiment is a recess.

The thickness of the silicon carbide semiconductor substrate 11 in the first region 14 is larger than the thickness of the silicon carbide semiconductor substrate 11 in the second region 15. Because it is desirable that the second principal surface 12 be flat in view of the fact that a device is formed thereon, the difference in thickness of the silicon carbide semiconductor substrate 11 between the first region 14 and the second region 15 is realized by creating a step on the first principal surface 13 along the boundary between the first region 14 and the second region 15. This step may be formed by grinding or polishing the first principal surface 13 by different amounts between the first region 14 and the second region 15. A first affected layer 19 is disposed under the first principal surface 13 in the first region 14, and a first affected layer 20 is disposed under the first principal surface 13 in the second region 15.

The thickness of the first affected layer 20 is larger than the thickness of the first affected layer 19, and the thickness of the first affected layer 19 and that of the first affected layer 20 are both larger than the thickness of a second affected layer 17 under the second principal surface 12. Alternatively, the configuration may be such that the linear density of crystal disturbances in the first affected layer 20 is higher than the linear density of crystal disturbances in the first affected layer 19, and the linear density of crystal disturbances in the first affected layer 19 and that in the first affected layer 20 are both higher than the linear density of crystal disturbances in the second affected layer 17 under the second principal surface 12.

In other words, the thickness of a crystallographically disturbed surface portion in the second region 15 is larger than the thickness of a crystallographically disturbed surface portion in the first region 14, and the thicknesses of the crystallographically disturbed surface portions in the first and second regions 14 and 15 are both larger than the thickness of a crystallographically disturbed surface portion under the second principal surface 12. Alternatively, the configuration may be such that the linear density of crystal disturbances in a surface portion in the second region 15 is higher than the linear density of crystal disturbances in a surface portion in the first region 14, and the linear densities of crystal disturbances in the surface portions in the first and second regions 14 and 15 are both higher than the linear density of crystal disturbances in a surface portion under the second principal surface 12. For example, the first affected layer 20 in the second region 15 has a thickness of 390 nm or more, and a linear density of crystal disturbances of 200 disturbances/mm or more.

Figure 15:
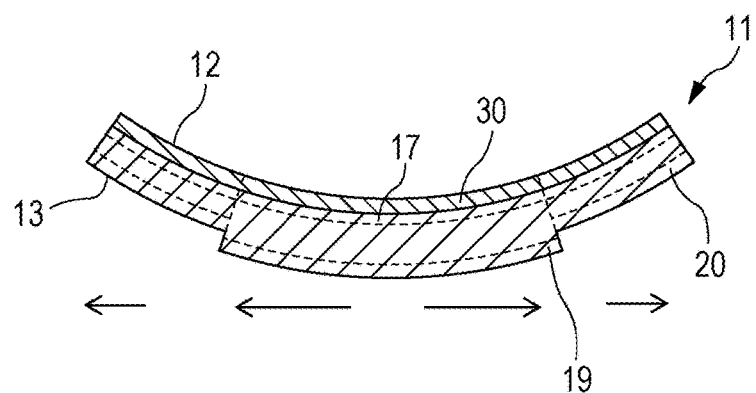
FIG. 15 is a schematic sectional view of the silicon carbide semiconductor substrate of the second embodiment after the formation of a semiconductor epitaxial layer.

FIG. 15 illustrates how the silicon carbide semiconductor substrate 11 of the present disclosure shown in FIGS. 14A and 14B is deformed upon the formation of a semiconductor epitaxial layer 30. The thickness of the silicon carbide semiconductor substrate 11 is larger in the first region 14 than in the second region 15. Thus, the distances from the middle point of the silicon carbide semiconductor substrate 11 in the thickness direction to the points up to which the stress works on the first principal surface 13 and the second principal surface 12 are longer in the first region 14 than in the second region 15. Accordingly, the moment of force produced by a certain stress is larger in the first region 14. As a result, the formation of the semiconductor epitaxial layer 30 results in a deformation of the silicon carbide semiconductor substrate 11 that is mainly the outward bending of the first region 14 as illustrated in FIG. 15. In other words, the second principal surface 12 is inwardly bent. As described hereinabove with reference to FIGS. 6 and 7, this deformation gives rise to a large positive change in the amount of SORI in the second principal surface 12. In this manner, the semiconductor epitaxial layer 30 may be formed on the second principal surface 12 while preventing the occurrence of interfacial dislocations.

Further, as described hereinabove, the thickness of the first affected layer 20 is larger than the thickness of the first affected layer 19, and the thickness of the first affected layer 19 and that of the first affected layer 20 are both larger than the thickness of the second affected layer 17 under the second principal surface 12. Alternatively, the configuration may be such that the linear density of crystal disturbances in the first affected layer 20 is higher than the linear density of crystal disturbances in the first affected layer 19, and the linear density of crystal disturbances in the first affected layer 19 and that in the first affected layer 20 are both higher than the linear density of crystal disturbances in the second affected layer 17 under the second principal surface 12. With these configurations, the difference in properties between the affected layers under the first and second principal surfaces 13 and 12 produces a larger stress in the second region 15 than in the first region 14. Thus, the second region 15 is subjected to a larger stress than the first region 14 by the formation of the semiconductor epitaxial layer 30 on the second principal surface 12. As a result, the formation of the semiconductor epitaxial layer 30 results in a deformation of the silicon carbide semiconductor substrate 11 in such a manner that the first principal surface 13 is outwardly bent to a further extent. In this manner, the semiconductor epitaxial layer 30 may be formed on the second principal surface 12 while preventing the occurrence of interfacial dislocations more efficiently.

Similarly to the first embodiment, the amount of SORE in the silicon carbide semiconductor substrate 11 carrying the semiconductor epitaxial layer 30 may be reduced as required by removing at least part of the first affected layer 19 and at least part of the first affected layer 20 disposed under the first principal surface 13 by a polishing method such as CMP after the formation of the semiconductor epitaxial layer 30.

While the present embodiment illustrates the silicon carbide semiconductor substrate 11 as having a step between the first region 14 and the second region 15, the step may be replaced by a tapered region on the first principal surface 13 that connects the first region 14 to the second region 15.

(Production Processes)

A process for producing the silicon carbide semiconductor substrates of the present disclosure will be described with reference to FIGS. 12B, 14B and 16. A silicon carbide semiconductor substrate workpiece 11 is cut from boule, and the first and second principal surfaces 13 and 12 are ground and polished. These steps may be performed in the conventional manner. During the process, the first principal surface 13 is polished with use of a rougher polishing agent or a harder abrasive cloth than for the second principal surface 12 to ensure that the affected layer will be formed under the first principal surface 13 in a larger thickness than the affected layer under the second principal surface 12. Here, the silicon carbide semiconductor substrate workpiece is indicated with the reference numeral 11 for the sake of convenience.

Figure 16:
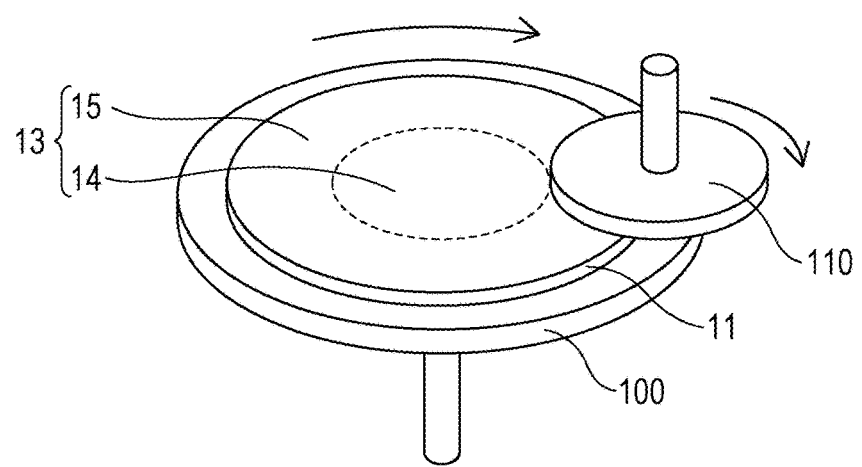
FIG. 16 is a view illustrating a process for producing silicon carbide semiconductor substrates of the present disclosure.

In the production of the silicon carbide semiconductor substrate 11 of the first embodiment, as illustrated in FIG. 16, the silicon carbide semiconductor substrate workpiece 11 is arranged on a platen 100 so that the first principal surface 13 faces upward. A polishing jig 110 is pressed against the first principal surface 13 of the silicon carbide semiconductor substrate workpiece 11 while the polishing jig 110 is in contact only with the second region 15 of the first principal surface 13. The polishing jig 110 has an abrasive cloth (not shown) on its surface that is placed in contact with the silicon carbide semiconductor substrate workpiece 11.

The silicon carbide semiconductor substrate workpiece 11 is rotated by rotating the platen 100, and the polishing jig 110 is rotated while supplying a slurry (not shown). The second region 15 of the silicon carbide semiconductor substrate workpiece 11 is processed while controlling conditions such as the hardness of the abrasive cloth, the roughness of the slurry, and the pressure at which the polishing jig 110 is pressed against the silicon carbide semiconductor substrate workpiece 11, so that the second region 15 will have different properties from the first region 14.

To produce the silicon carbide semiconductor substrate 11 of the first embodiment, the affected layer in the second region 15 is formed in a larger thickness than in the first region 14. For this purpose, the processing of the second region 15 involves one or more conditions such as a rougher slurry, a harder abrasive cloth and an increased pressure for pressing the polishing jig 110. Such processing increases the surface roughness of the first principal surface 13 in the second region 15, thus resulting in an increase in the thickness of the affected layer in the second region 15 and an increase in the linear density of crystal disturbances in the second region 15 over the properties in the first region 14.

To produce the silicon carbide semiconductor substrate 11 of the second embodiment, the silicon carbide semiconductor substrate workpiece 11 is processed so that its thickness becomes larger in the first region 14. For this purpose, the second region 15 of the silicon carbide semiconductor substrate workpiece 11 is polished while involving one or more conditions such as a rougher slurry, a harder abrasive cloth and an increased pressure for pressing the polishing jig 110 as compared to the conditions in the production of the silicon carbide semiconductor substrate 11 of the first embodiment. For example, the thickness of the silicon carbide semiconductor substrate workpiece 11 in the second region 15 may be easily reduced by using a diamond powder or the like as the slurry. After this polishing, the thickness of the affected layer in the first region 14 is reduced by removing at least part of the affected layer in the first region 14 while involving one or more conditions such as a fine slurry, a soft abrasive cloth and a decreased pressure for pressing the polishing jig 110. For example, a silicon oxide powder may be used as the slurry. As a result of such processing, the silicon carbide semiconductor substrate 11 has a larger thickness in the first region 14 than in the second region 15, and the affected layer in the second region 15 has a larger thickness or a higher linear density of crystal disturbances than the affected layer in the first region 14.

After the production of the silicon carbide semiconductor substrate 11, as illustrated in FIG. 13 or FIG. 15, a semiconductor epitaxial layer 30 may be formed on the second principal surface 12 of the silicon carbide semiconductor substrate 11. By virtue of the aforementioned structure of the silicon carbide semiconductor substrate 11, the semiconductor epitaxial layer 30 may be prevented from the occurrence of interfacial dislocations.

When a need arises to reduce the amount of SORI in the silicon carbide semiconductor substrate 11 carrying the semiconductor epitaxial layer 30, at least part of the first affected layer 19 and at least part of the first affected layer 20 disposed under the first principal surface 13 may be removed by a polishing method such as CMP after the formation of the semiconductor epitaxial layer 30. In this manner, the flatness on the surface of the semiconductor epitaxial layer 30 may be enhanced.

The process of the present embodiment for producing the silicon carbide semiconductor substrates may be performed under a wide range of conditions such as the types of abrasive cloths and slurries and the magnitudes of the pressing pressure. While the first embodiment and the second embodiment illustrate the first principal surface as having the first region and the second region, there may be three or more regions having different thicknesses of the affected layers or different linear densities of crystal disturbances in the affected layers. Further, the first region, which is illustrated as being a circle in the above embodiments, may have other shape such as an elliptical shape. The first region may be eccentric in any direction as long as the first region includes the center of the first principal surface.

The embodiments discussed above should be construed as illustrative and not as limiting in all aspects. The scope of the present disclosure is not limited to the description provided hereinabove, but is defined by the appended claims and embraces equivalents to the claims and all modifications within the scope of the disclosure.

What is claimed is:

1. A silicon carbide semiconductor substrate having a first principal surface and a second principal surface opposite to the first principal surface, the silicon carbide semiconductor substrate comprising:
    a silicon carbide semiconductor crystal;
    a first affected layer having crystal disturbances and disposed under the first principal surface; and
    a second affected layer having crystal disturbances and disposed under the second principal surface,
    wherein a linear density of crystal disturbances in the first affected layer in a first region including a center of the first principal surface is lower than a linear density of crystal disturbances in the first affected layer in a second region surrounding the first region in a plane view, and
    wherein the linear density of the crystal disturbances in the first affected layer in the first region and the linear density of crystal disturbances in the first affected layer in the second region are both higher than a linear density of crystal disturbances in the second affected layer.

2. The silicon carbide semiconductor substrate according to claim 1, wherein the linear density of the crystal disturbances in the first affected layer in the second region is 200 disturbances/mm or more.

* * * * *